(12) United States Patent
Squire et al.

(10) Patent No.: US 10,749,283 B2
(45) Date of Patent: Aug. 18, 2020

(54) ELECTRONICS ASSEMBLY FOR COUPLING TWO CIRCUIT BOARDS

(71) Applicant: Sevcon Limited, Gateshead (GB)

(72) Inventors: Gary Squire, Gateshead (GB); Matt Jackson, Gateshead (GB); Peter Barrass, Gateshead (GB)

(73) Assignee: Sevcon Limited, Gateshead (GB)

( * ) Notice: Subject to any disclaimer, the term of this patent is extended or adjusted under 35 U.S.C. 154(b) by 0 days.

(21) Appl. No.: 15/739,282

(22) PCT Filed: Jul. 4, 2016

(86) PCT No.: PCT/GB2016/052017
§ 371 (c)(1),
(2) Date: Dec. 22, 2017

(87) PCT Pub. No.: WO2017/006100
PCT Pub. Date: Jan. 12, 2017

(65) Prior Publication Data
US 2018/0183164 A1    Jun. 28, 2018

(30) Foreign Application Priority Data
Jul. 3, 2015  (GB) .................................. 1511729.4

(51) Int. Cl.
*H01R 12/00* (2006.01)
*H05K 1/00* (2006.01)
(Continued)

(52) U.S. Cl.
CPC ........... *H01R 12/73* (2013.01); *H01R 12/714* (2013.01); *H01R 12/716* (2013.01);
(Continued)

(58) Field of Classification Search
CPC .... H01R 12/73; H01R 12/714; H01R 12/716; H01R 12/52; H01R 12/58; H01R 13/2421;
(Continued)

(56) References Cited

U.S. PATENT DOCUMENTS 4,029,375 A * 6/1977 Gabrielian ........... H01R 12/714
439/66
5,308,252 A * 5/1994 Mroczkowski .... H01R 13/2435
439/591
(Continued)

FOREIGN PATENT DOCUMENTS

EP    1 898 497 A2    3/2008
EP    2 112 717 A2    10/2009
(Continued)

*Primary Examiner* — Hae Moon Hyeon
(74) *Attorney, Agent, or Firm* — Woodard Emhardt Henry Reeves & Wagner LLP

(57) ABSTRACT

A power electronics assembly for an electric motor controller is disclosed having a first circuit board, a second circuit board spaced from the first circuit board by a stand-off distance, an electrically insulating housing held between the first circuit board and the second circuit board, multiple conductors, and a restraint adapted to hold the electrically insulating housing to the first circuit. The electrically insulating housing includes multiple channels. Each of the multiple conductors are arranged to provide a conduction path through a corresponding channel and are each trapped between the electrically insulating housing and the first circuit board and biased into electrical contact with an electrical conductor of the first circuit board.

20 Claims, 4 Drawing Sheets

(51) Int. Cl.
*H01R 12/73* (2011.01)
*H01R 12/71* (2011.01)
*H01R 13/24* (2006.01)
*H05K 1/14* (2006.01)
*H01R 43/20* (2006.01)
*H05K 7/14* (2006.01)
*H01R 12/70* (2011.01)
*H01R 12/58* (2011.01)
*H01R 107/00* (2006.01)
*H05K 1/02* (2006.01)
*H01R 12/52* (2011.01)

(52) U.S. Cl.
CPC ....... H01R 13/2421 (2013.01); H01R 43/205 (2013.01); H05K 1/144 (2013.01); H05K 7/1427 (2013.01); *H01R 12/523* (2013.01); *H01R 12/58* (2013.01); *H01R 12/7023* (2013.01); *H01R 2107/00* (2013.01); *H01R 2201/10* (2013.01); *H05K 1/0271* (2013.01); *H05K 2201/0311* (2013.01); *H05K 2201/042* (2013.01); *H05K 2201/068* (2013.01); *H05K 2201/10166* (2013.01); *H05K 2201/10189* (2013.01)

(58) Field of Classification Search
CPC . H01R 13/2428; H01R 13/2435; H01R 11/18
USPC ............................................ 439/66, 700, 65
See application file for complete search history.

(56) References Cited

U.S. PATENT DOCUMENTS

| | | | |
|---|---|---|---|
| 5,975,914 A | 11/1999 | Uchida | |
| 6,464,511 B1 | 10/2002 | Watanabe et al. | |
| 6,663,439 B2 * | 12/2003 | Henry | H01R 13/2421 439/700 |
| 6,814,626 B2 * | 11/2004 | Wen-Yao | H01R 13/7036 439/515 |
| 6,821,131 B2 * | 11/2004 | Suzuki | H01R 13/2421 439/700 |
| 6,844,749 B2 * | 1/2005 | Sinclair | G01R 1/0466 324/755.05 |
| 6,866,519 B2 * | 3/2005 | Fan | H01R 13/2421 439/66 |
| 7,037,113 B2 * | 5/2006 | Soh | H01R 12/714 439/66 |
| 7,074,047 B2 * | 7/2006 | Tutt | H01R 13/2414 439/66 |
| 7,134,909 B2 * | 11/2006 | Baba | G01R 1/0416 439/557 |
| 7,226,293 B2 * | 6/2007 | Na | H01C 21/20 439/66 |
| 7,270,550 B1 * | 9/2007 | Peng | H01R 13/2428 439/66 |
| 7,740,488 B2 * | 6/2010 | Taylor | H01R 12/714 439/66 |
| 7,878,834 B2 * | 2/2011 | Sherman | H01R 12/57 439/324 |
| 9,281,584 B2 * | 3/2016 | Hashiguchi | H01R 12/714 |
| 2004/0137767 A1 | 7/2004 | Suzuki et al. | |
| 2005/0009381 A1 | 1/2005 | Fan et al. | |
| 2009/0186495 A1 | 7/2009 | Taylor | |
| 2011/0298487 A1 | 12/2011 | Katsuma et al. | |
| 2015/0099376 A1 * | 4/2015 | Hashiguchi | H01R 12/714 439/66 |
| 2015/0111400 A1 * | 4/2015 | Hashiguchi | H01R 13/2428 439/66 |

FOREIGN PATENT DOCUMENTS

| | | |
|---|---|---|
| EP | 2 843 771 B1 | 11/2016 |
| GB | 1384550 A | 2/1975 |

\* cited by examiner

ELECTRONICS ASSEMBLY FOR COUPLING TWO CIRCUIT BOARDS

BACKGROUND

The present invention relates to an electronics assembly, for example a power electronics assembly, for coupling a first circuit board to a second circuit board, and a method of manufacturing an electronics assembly.

Power electronics assemblies may receive direct current (DC) power and convert DC power into alternating current (AC) power for use in operating an electric motor. These power assemblies may comprise elements of the power electronics that evolve considerable heat when in use.

The present disclosure aims to address technical problems associated with power electronics assemblies that may get hot in use.

SUMMARY

Aspects and examples of the present invention are set out in the claims.

BRIEF DESCRIPTION OF THE DRAWINGS

Aspects of the disclosure will now be described in detail, by way of example only, with reference to the accompanying drawings, in which.

DETAILED DESCRIPTION

Figure 1:
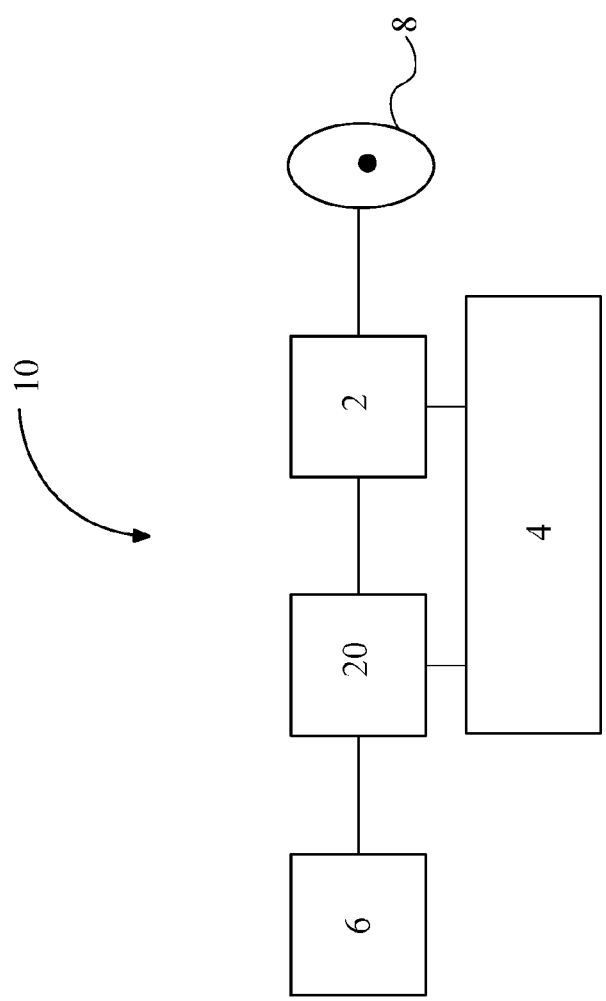
FIG. 1 shows a functional block diagram of an electric vehicle.

In overview, the electric motor system 10 of FIG. 1 comprises motor 2 and a controller 20 to control operation of the motor. The electric motor system 10 also comprises a cooling apparatus 4. Cooling apparatus 4 is coupled to both the motor 2 and controller 20 to remove heat produced by the operation of the motor 2 and controller 20. A drive output of the motor provides torque to drive a drive plate 8 coupled to a drive axle of a vehicle. The controller 20 comprises a power electronics assembly 100 as shown for example in FIGS. 2, 3 and 4. Although embodiments of the disclosure have particular usefulness in vehicles other uses are envisaged.

Power electronics assembly 100 comprises a first circuit board 101 and a second circuit board 103. The power electronics assembly 100 is configured to maintain an electrical connection between the first circuit board 101 and the second circuit board 103 in the event that the second circuit board 103 moves relative to the first circuit board 101, for example due to movement, such as vibrations and/or thermal expansion of the second circuit board 103.

The second circuit board 103 is spaced from the first circuit board 101 by stand-off distance 104. For example the two boards may be arranged parallel to each other with a pre-determined stand-off spacing between them. As explained below with reference to FIG. 2, an electrically insulating housing is held between the first circuit board and the second circuit board. A number of channels pass through this housing and a conductor is arranged in each. The conductors are arranged to move resiliently along the channels—for example they may be resiliently deformable or coupled to a bias provider of some kind, such as a spring or any other biasing means. A restraint, such as a clip, holds the electrically insulating housing to the first circuit board and opposes the force on the electrically insulating housing caused by the biasing of these conductors. This enables the housing to be held in place on the first circuit board by the restraint, with the biased conductors in position.

A second circuit board can then be fixed to the first circuit board by a fixture such as a bolt. Arranging the second circuit board in this way presses the conductors toward the first circuit board and reduces the force on the electrically insulating housing caused by the biasing of the plurality of conductors.

The first circuit board 101 may comprise a composite material, for example a fiberglass material, for example it may be an FR4 board. The second circuit board 103 may comprise an insulated metal substrate (IMS), for example an aluminum substrate insulated with a layer of a dielectric such as a polyamide, for example Kapton. In some examples, the second circuit board 103 is coupled to the cooling apparatus 4, for example by a heat sink 102. Interposed between the first circuit board 101 and the second circuit board 103 is electrically insulating housing 107. In some embodiments, the first circuit board 101 and the second circuit board 103 are mechanically coupled to each other. This mechanical coupling may fix a stand-off distance 104 between the two circuit boards—for example the boards may be spaced apart and generally parallel with each other, and the electrically insulating housing may extend between the boards, in a direction transverse to the two boards.

Figure 2:
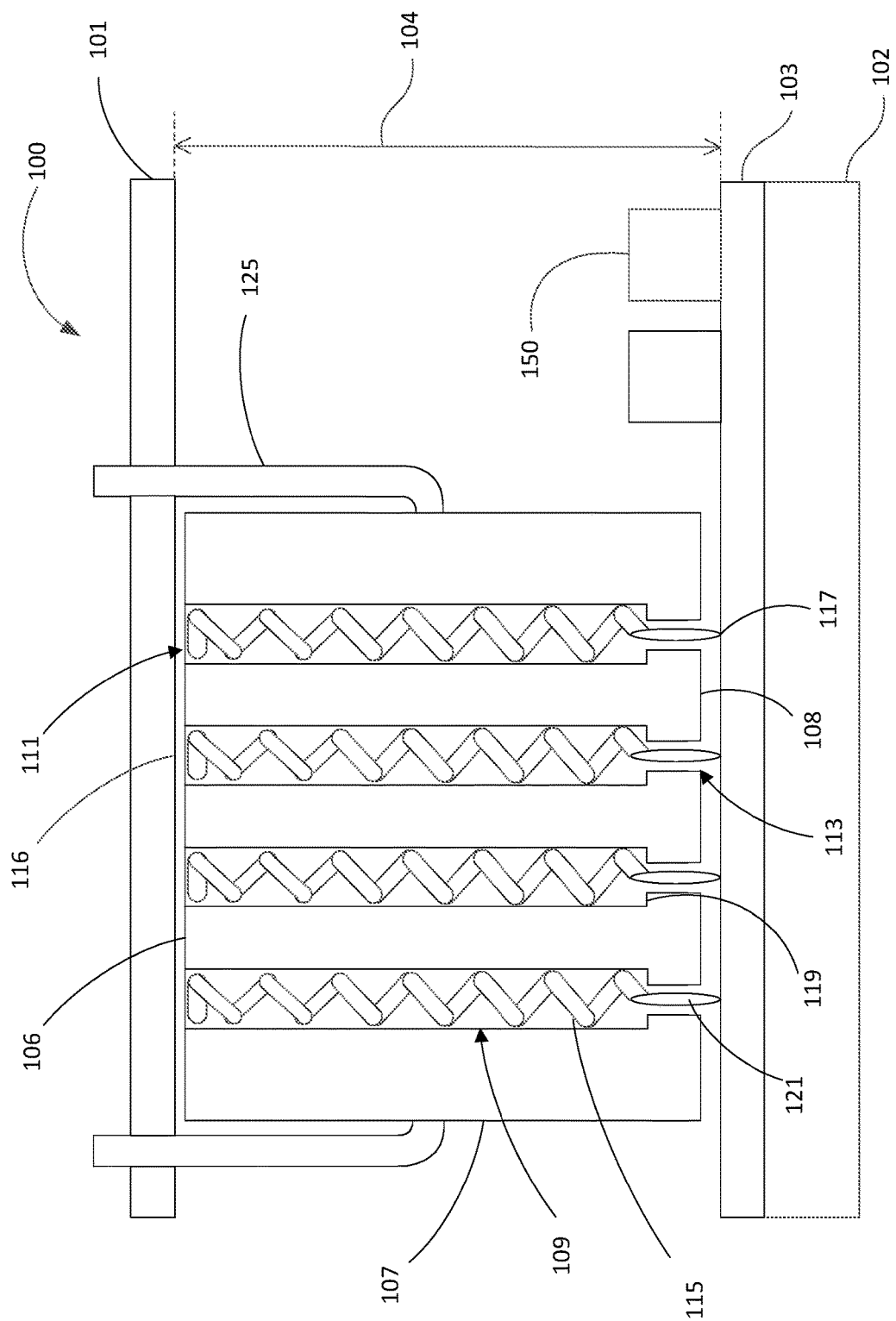
FIG. 2 shows a cross-section through a power electronics assembly for an electric vehicle shown in FIG. 1.
Figure 3:
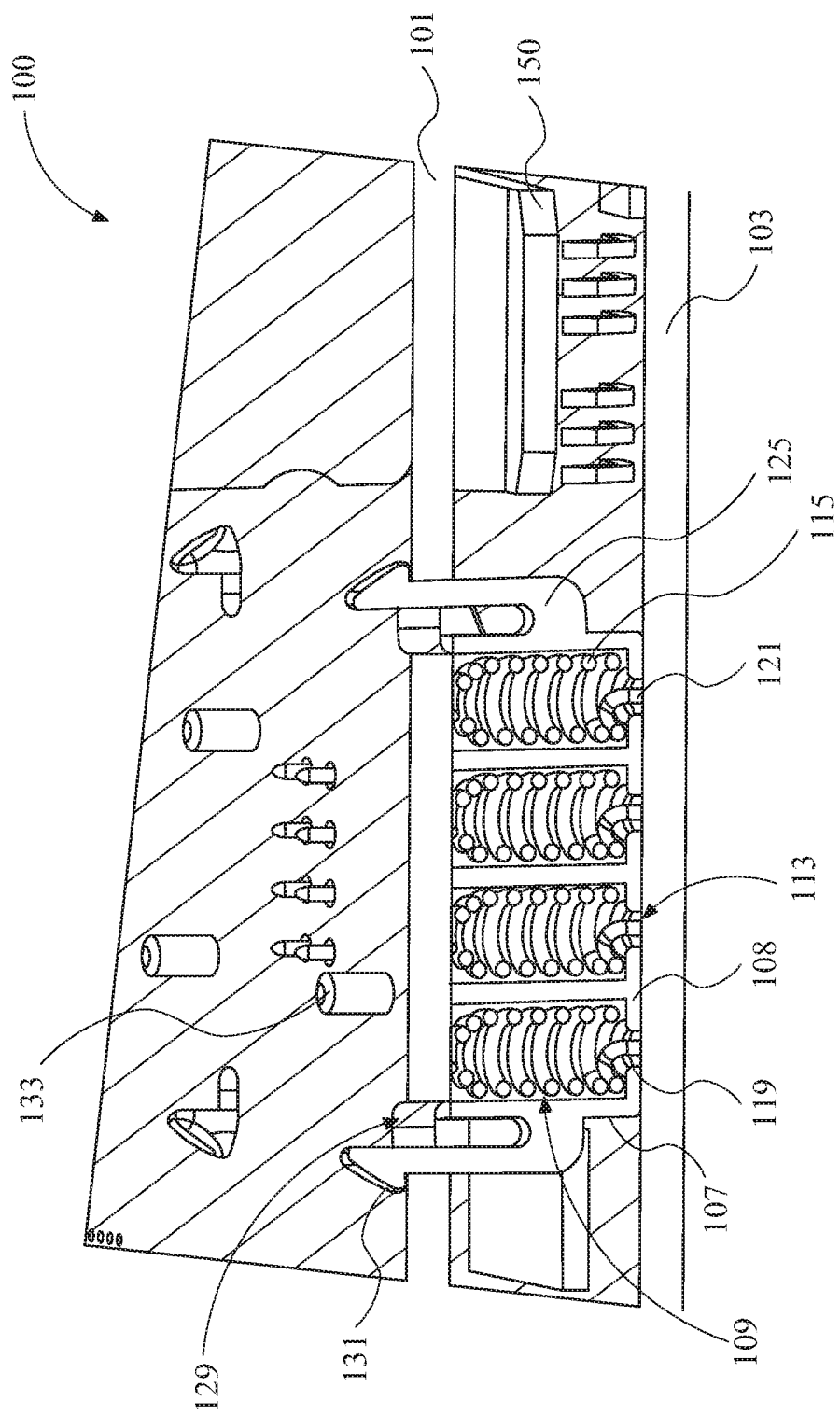
FIG. 3 shows a perspective view of another power electronics assembly for an electric vehicle shown in FIG. 1.
Figure 4:
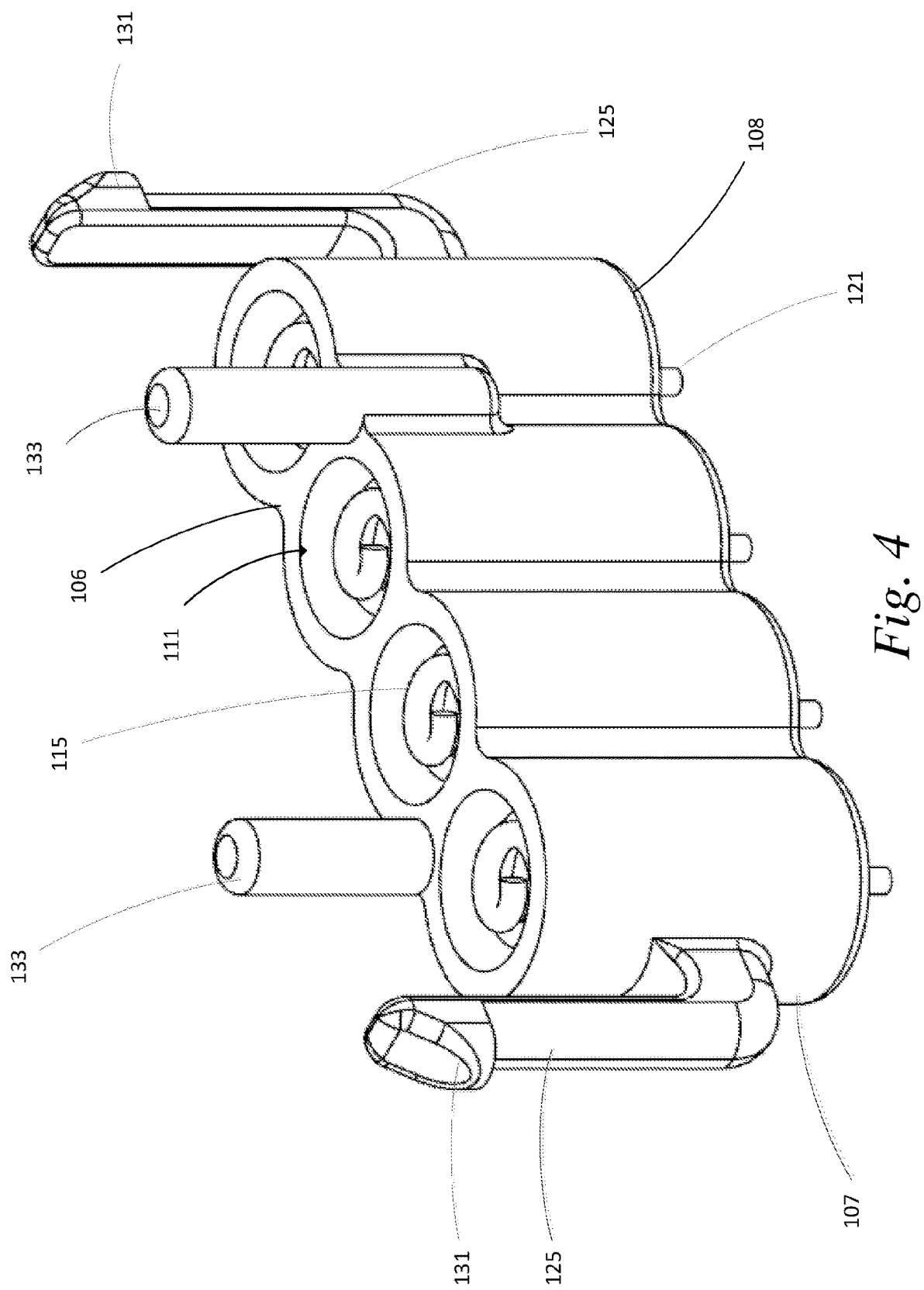
FIG. 4 shows a perspective view of the electrically insulating housing of the power electronics assembly shown in FIG. 3.

As noted above, the electrically insulating housing 107 comprises a plurality of channels 109, in the examples shown in FIGS. 2, 3 and 4 four channels 109, that extend from a first side 106 of the electrically insulating housing 107 to a second side 108 of the electrically insulating housing 107. The channels 109 each terminate in a corresponding first aperture 111 on the first side 106 of the electrically insulating housing 107 and in a corresponding second aperture 113 on the second side 108 of the electrically insulating housing 107.

In the examples shown in FIGS. 2, 3 and 4, each of the second plurality of apertures 113 is narrower than each of the first plurality of apertures 111. The channels 109 each have a longitudinal axis in a direction corresponding to a major dimension of each of the channels 109. The longitudinal axis of each of the channels 109 may be aligned with each corresponding first 111 and second 113 aperture. In the examples shown in FIGS. 2, 3 and 4, the channels 109 are aligned with each other in a direction transverse to the longitudinal axis of each of the channels 109.

Although in the examples shown in FIGS. 2, 3 and 4, the first plurality of apertures 111 and the second plurality of apertures 113 are opposing each other and aligned along the longitudinal axis of each of the channels 109, the apertures 111, 113 may be offset from each other and/or from the longitudinal axis of the channels 109.

The channels 109 each further comprise a retaining member 119, which in the examples shown in FIGS. 2, 3 and 4 is a flange located at an end of each of the channels 109. The retaining member 119 of each channel 109 in these examples comprises a narrowing of each channel 109 towards the second side 108 of the electrically insulating housing 107 provided by the flange and resulting in each second aperture 113 being narrower than each first aperture 111.

The electrically insulating housing 107 further comprises a clip 125 for detachably coupling the electrically insulating housing 107 to the first circuit board 101. In the examples shown in FIGS. 2, 3 and 4, the clip 125 comprises two legs. Each leg may be located on an opposite side of the electrically insulating housing 107. The legs may be elongate and aligned with the channels 109. The legs and the channels may also be aligned in a direction transverse to the longitudinal axis of each of the channels 109. Each leg may be coupled to the electrically insulating housing 107 at its proximal end, and may be resilient so that the distal end of the leg can be deflected but will spring back. Each leg may comprise a flange 131 at its distal end, as shown in FIGS. 3 and 4. The flange may comprise a ramp portion so that the leg can be deflected by the ramp as the leg is pushed through an aperture, but then will spring back so that the flange captures the leg in the aperture. In this configuration, each leg extends beyond the first side 106 of the electrically insulating housing 107 by a distance greater than the thickness of the first circuit board 101, so that a portion of each leg comprising the flange extends beyond the first circuit board 101 when the electrically insulating housing 109 is coupled to the first circuit board 101. For example, the distance along each leg of the clip 125 between the flange to a point on the leg parallel to the first side 106 of the electrically insulating housing 107 may correspond to the thickness of the first circuit board 101.

The electrically insulating housing 107 may further comprise a rigid locator such as a locator pin 133, for example a pair of locator pins 133. Such locator pins 133 may be arranged parallel to the longitudinal axis of each of the channels 109, and in the examples shown in FIGS. 2, 3 and 4, are arranged parallel to the longitudinal axis of the legs of the clip 125. The locator pins 133 may be longer than the clip 125, for example the locator pins 133 may be longer than the legs of the clip 125. The locator pins 133 are coupled to the electrically insulating housing 107, and in the examples shown in FIGS. 2, 3 and 4, the two locator pins 133 are coupled to the electrically insulating housing 107 on opposing sides of the electrically insulating housing 107, and out of alignment with the legs of the clip 125 and out of alignment with a direction of alignment of the channels 109, in a direction transverse to the longitudinal axis of the channels 109. In the examples shown in FIGS. 2, 3 and 4, one locator pin 133 is coupled to the electrically insulating housing 107 between a first and second channel 109 to one side of the electrically insulating housing 107, and a second locator pin 133 is coupled to the electrically insulating housing 107 between a third and fourth channel 109 to another side of the electrically insulating housing 107.

Each channel 109 holds a corresponding bias provider 115 that provides a biasing force on a corresponding conductor of the assembly. Each bias provider 115 may extend substantially the full length of each corresponding channel 109. In the examples shown in FIGS. 2, 3 and 4, the bias provider 115 is a helical spring, but other biasing means may be used, for example a leaf spring, an electromechanical actuator, a rubber grommet, or a resilient member. In some examples, each channel 109 may hold a plurality of bias providers 115, for example two bias providers 115 separated by a resilient member. In some examples, each channel 109 may hold a plurality of bias providers 115, wherein each bias provider 115 interacts with a corresponding retaining member 119, such that each channel 109 holds a plurality of retaining members 119.

Each bias provider 115 comprises a corresponding conductor that projects through a corresponding one of the first plurality of apertures 111 and through a corresponding one of the second plurality of apertures 113.

The first circuit board 101 comprises contacts 116. The contacts 116 of the first circuit board 101 may be aligned with each of the first plurality of apertures 111 of the electrically insulating housing 107. There may be as many contacts 116 on the first circuit board 101 as there are channels 109.

The second circuit board 103 also comprises contacts 117. The contacts 117 of the second circuit board 103 may be aligned with each of the second plurality of apertures 113 of the electrically insulating housing 107. There may be as many contacts 117 on the second circuit board 103 as there are channels 109.

The contacts 116, 117 may be substantially the same size as the first and/or second apertures 111, 113 or may be smaller or larger than the first and/or second apertures 111, 113. For example, the contacts 117 on the second circuit board 103 may be substantially the same size as, or may be smaller than, each of the second plurality of apertures 113. The contacts 116 on the first circuit board 101 may be substantially the same size as, or may be smaller than, each of the first plurality of apertures 111.

In the examples shown in FIGS. 2, 3 and 4, each conductor comprises a pin 121 that fits in and projects through each of the corresponding second plurality of apertures 113 to engage the corresponding contact 117 on the second circuit board 103. For example, each conductor may comprise the pin 121 at an end that, in use, corresponds to the second side 108 of the electrically insulating housing 107 facing the second circuit board 103. The pin 121 may be in a direction parallel to the bias direction and/or the longitudinal direction of each channel 109.

In some examples, however, each conductor may not comprise a pin. In some examples, each conductor may comprise a portion transverse to the bias direction and/or the longitudinal direction of each channel 109. For example, each conductor may comprise a coil or helix structure that spirals or coils inwards from an outer diameter of the conductor to an inner diameter.

In some examples, both ends of each conductor may be the same. In some examples, both ends of each conductor may comprise, for example, a helix or coil of varying diameter. In some examples the conductor's coil diameter may vary over its length. For example, the coil diameter of the conductor may narrow towards an end so that each conductor passes through a corresponding narrowing of each channel.

In the examples shown in FIGS. 2, 3 and 4, the channels 109, apertures 111, 113 and contacts 116, 117 are all aligned along the longitudinal axis of the channels 109, although as mentioned above, in other examples at least one of the channels 109, apertures 111, 113 and contacts 116, 117 may be offset from each other and/or the longitudinal axis of each of the channels 109.

In some examples, the coil diameter of the conductor and/or bias provider 115 may change over a portion of its length. For example, the coil diameter of the conductor and/or bias provider 115 may increase towards an end so that the conductor and/or bias provider 115 forms an outward spiral. In some examples, the coil diameter of the conductor and/or bias provider 115 may decrease towards an end so that the conductor and/or bias provider 115 forms an inward spiral.

In the examples shown in FIGS. 2, 3 and 4, each bias provider 115 comprises each corresponding conductor so that the helical spring is both the bias provider 115 and the conductor and is therefore a conductive bias provider 115. In the examples shown in FIGS. 2, 3 and 4, the coil diameter of the conductive bias provider 115 is substantially constant over the length of the bias provider 115 along its longitudinal axis. However, the coil diameter of the conductive bias provider 115 may decrease over a portion of its length, for example near an end of the conductive bias provider 115 opposite to the end with the pin 121 and near the first side 106 of the electrically insulating housing 107. The conductive bias provider 115 may therefore form an inward spiral at an end, or at both ends. In other examples, the coil diameter of the conductive bias provider 115 may increase over a portion of its length.

The contacts 117 of the second circuit board 103 are electrically coupled to an inverter 150. The first 101 and/or second 103 circuit boards may comprise other functionality which may include, for example, microprocessors, power supplies, capacitors and inductors configured for control filtering and conditioning. For example, the first circuit board 101 of the power electronics assembly may comprise a timing chip for controlling operation of the inverter 150.

In some examples the first circuit board 101 and the second circuit board 103 are mechanically and electrically coupled by a power contact. The power contact may couple the inverter 150 on the second circuit board 103 to an electrical circuit on the first circuit board 101 and may be configured to pass AC current from the first circuit board to the inverter on the second circuit board 103, and DC current from the inverter on the second circuit board 103 to the electrical circuit on the first circuit board 101.

The controller 20 is configured to derive a three-phase alternating current (AC) supply for the motor 2 from a direct current (DC) power source 6, in this example a battery. The inverter 150 is configured to perform inversion, filtering and conditioning processing on the DC output of the power source 6 to provide the motor with the required AC power source. The inverter 150 is operable to convert a DC input to a three-phase AC output for use by the motor 2. Any suitable form of inverter may be used. In a preferred example, an insulated gate bipolar transistor (IGBT) inverter is used. In some cases MOSFETs or other IGFETs may also be used. Preferred characteristics of the IGBT inverter include high efficiency and fast switching.

The clip 125 in the examples shown in FIGS. 2, 3 and 4 is configured to detachably couple the electrically insulating housing 107 to the first circuit board 101. The legs of the clip 125 are adapted to be received by corresponding holes 129 in the first circuit board 101 such that the clip 125 can "snap-fit" with the first circuit board 101.

The first circuit board 101 and the second circuit board 103 may be separated by a predetermined distance, for example to allow cooling of the first 101 and/or second 103 circuit boards. A dimension of the electrically insulating housing 107 may fit within the predetermined distance between the first circuit board 101 and the second circuit board 103. For example, the full length of each channel 109 may fit within the predetermined distance between the first circuit board 101 and the second circuit board 103. For example, the distance between the first side 106 and the second side 108 of the electrically insulating housing 107 may fit within the predetermined distance between the first circuit board 101 and the second circuit board 103.

The channels 109 of the electrically insulating housing 107 are configured to receive and hold the bias provider 115. For example they may be cylindrical tunnels through an insulating body. The bias provider 115 of each channel 109 is configured to fit within each channel 109. The retaining member 119 of each channel 109 is configured to interact with the bias provider 115 to project a corresponding conductor through a corresponding one of the first plurality of apertures 111 and project the conductor through a corresponding one of the second plurality of apertures 113 to electrically couple the first circuit board 101 with the second circuit board 103.

A portion of the clip 125 may be configured to move in a direction transverse to the longitudinal axis of each channel 109 when the electrically insulating housing 107 is coupled to the first circuit board 101. For example, the legs of the clip 125 may be configured to move in a direction transverse to the longitudinal axis of each channel 109 when the electrically insulating housing 107 is coupled to the first circuit board 101. In the examples shown in FIGS. 3 and 4, the flange on each leg of the clip 125 may comprise a ramp portion that is operable to bend the legs in a direction transverse to the longitudinal axis of each of the channels 109 as the electrically insulating housing 107 is pushed onto the first circuit board 101 in a direction parallel with the longitudinal axis of each of the channels 109. The flange 131 on each leg may be configured to detachably secure the electrically insulating housing 107 to the first circuit board 101. The legs of the clip 125 may be operable to detach the electrically insulating housing 107 from the first circuit board 101 by squeezing the legs together in a direction transverse to the longitudinal axis of each of the channels 109, for example so that the flange on each leg can pass through the corresponding hole 130 on the first circuit board 101.

The locator pins 133 are configured to guide the electrically insulating housing 107 as it is detachably coupled to and pressed against the first circuit board 101. Because the locator pins 133 may be longer than the legs of the clip 125, the locator pins 133 may be configured to align with a corresponding hole in the first circuit board 101 so that as the electrically insulating housing 107 is pressed towards the first circuit board 101 in a direction parallel to the longitudinal axis of the legs of the clip 125 and the channels 109, the legs of the clip 125 are already aligned with the corresponding holes 129 of the first circuit board, to prevent damage occurring to the legs of the clip 125. Because the locator pins 133 and the legs of the clip 125 may be aligned parallel to the longitudinal axis of each of the channels 109, the electrically insulating housing 107 can be slid into position on the first circuit board 101.

The bias provider 115 of each channel 109 is configured to operate in an extended configuration and in a compressed configuration. The bias provider 115 of each channel 109 is configured to be in the extended configuration when the electrically insulating housing 107 is detached from the first circuit board 101 and in the compressed configuration when the electrically insulating housing 107 is coupled to the first circuit board 101. In the extended configuration, each bias provider 115 may be configured to be longer than the length of each of the channels 109 along their longitudinal axis.

The electrically insulating housing 107 is configured to retain each bias provider 115 in each corresponding channel 109 when coupled to the first circuit board 101. The electrically insulating housing 107 may be configured to retain each bias provider 115 in each corresponding channel 109 in its compressed configuration. In the examples shown in FIGS. 2, 3 and 4, the retaining member 119 of each channel 109 is configured to interact with each bias provider 115 to prevent the bias provider 115 from escaping through the channel 109 beyond the retaining member 119. The electrically insulating housing 107 may therefore be configured to retain the bias provider 115 between the retaining member 119 and the first circuit board 101.

In some examples where the bias provider 115 comprises a spring or similar structure, for example where each bias provider 115 comprises each corresponding conductor, and where the coil diameter varies over its length, the retaining member 119 may be configured to interact with the bias provider 115 at a point where a change in coil diameter occurs. For example, the retaining member 119 may comprise a flange and/or a narrowing in the diameter of each channel 109, and the flange or narrowing in diameter of each channel 109 may interact with the bias provider 115 such that a portion of the bias provider 115 with a larger coil diameter is arranged to be trapped between the first circuit board 101 and the retaining member 119, and a portion of the bias provider 115 with a smaller coil diameter is arranged to be between the second circuit board 103 and the retaining member 119 in use.

The bias provider 115 of each channel 109 is configured to press each corresponding conductor against a corresponding contact 116, 117 on at least one of the circuit boards 101, 103. For example, the bias provider 115 of each channel 109 is configured to press each corresponding conductor against a corresponding contact on at least one of the circuit boards 101, 103 along an axis corresponding to the longitudinal axis of each channel 109. In the examples shown in FIGS. 2, 3 and 4, each bias provider 115 is configured to press each corresponding conductor against a corresponding contact 116 on the first circuit board 101 and against a corresponding contact 117 on the second circuit board 103 to maintain an electrical connection between the first circuit board 101 and the second circuit board 103. In this way, the power electronics assembly 100 is arranged to electrically couple the first circuit board 101, for example components of the power electronics, for example a timing chip, to the inverter 150 of the second circuit board 103.

The electrically insulating housing 107 may further be configured to align each corresponding conductor of each bias provider 115 with the corresponding contact 116 on the first circuit board 101 and the corresponding contact 117 on the second circuit board 103.

In some examples, a portion of each conductor is configured to project through a corresponding one of the second plurality of apertures 113 to press against the corresponding contact 117 on the second circuit board 103. In the examples shown in FIGS. 2, 3 and 4, the portion of each conductor configured to project through a corresponding one of the second plurality of apertures 113 is a pin 121. In some examples, a portion of each conductor is configured to project through a corresponding one of the first plurality of apertures 113 to press against the corresponding contact 116 on the first circuit board 101.

The conductor may be configured to increase its surface area in contact with a contact 116, 117 when pressed against the contact 116, 117, for example when each bias provider 115 is in a compressed configuration. For example, where each conductor comprises a portion transverse to the bias direction and/or the longitudinal direction of each channel 109, the portion transverse to the bias direction and/or longitudinal direction of each channel 109 is configured to increase the contact area between the conductor and a corresponding contact pad 116, 117 on at least one of the circuit boards 101, 103.

For example, where the bias provider 115 comprises each conductor, and the bias provider 115 is a helical spring and the coil diameter of the helical spring decreases towards an end opposite to that of the pin 121, the decrease in coil diameter is configured to increase the surface area of the helical spring in contact with the contact 116 when biased against the first circuit board 101.

The first side 106 of the electrically insulating housing 107 may be adapted to abut and/or form a seal with the first circuit board 101 when coupled to the first circuit board 101. The second side 108 of the electrically insulating housing 107 may be adapted to abut and/or form a seal with the second circuit board 103 when the electrically insulating housing 107 is coupled to the first circuit board 101 and the first circuit board 101 is coupled to the second circuit board 103.

The power electronics assembly may be manufactured by providing the first circuit board 101, providing the electrically insulating housing 107 comprising the plurality of channels 109, inserting the corresponding bias provider 115 through each first aperture 111 into each channel 109 to engage each corresponding retaining member 119, and coupling the electrically insulating housing 107 to the first circuit board 101 so that the first side 106 of the electrically insulating housing 107 faces the first circuit board 101, thereby trapping each bias provider 115 within each corresponding channel 109 of the electrically insulating housing 107 between each corresponding retaining member 119 and the first circuit board 101.

The electrically insulating housing 107, the clip 125 and the locator pins 133 may be integrally moulded, or for example, the clip 125 and/or the locator pins 133 may be couple to the electrically insulating housing 107, for example by ultrasonic welding. The electrically insulating housing 107 may be made from a plastics material.

The first circuit board 101 may further be mechanically coupled to the second circuit board 103, so that the second side 108 of the electrically insulating housing 107 faces the second circuit board 103, and each of the conductors electrically engages with a corresponding contact 117 on the second circuit board 103.

Coupling the electrically insulating housing 107 to the first circuit board 101 comprises pressing the electrically insulating housing 107 against the first circuit board 101 in a direction parallel to the longitudinal axis of each of the channels 109. It may first comprise aligning each of the locator pins 133 with a corresponding hole in the first circuit board 101 so that the legs of the clip 125 are also aligned with their corresponding holes 129 in the first circuit board 101. Each channel 109 and/or each bias provider 115 and/or corresponding conductor may also be aligned with the corresponding contacts 116 on the first circuit board 101. Coupling the electrically insulating housing 107 may further comprise sliding the locator pins 133 within their corresponding holes in the first circuit board 101, as the electrically insulating housing 107 is pressed against the first circuit board 101.

In the examples shown in FIGS. 3 and 4, as the electrically insulating housing 107 is pressed against the first circuit board 101 in a direction parallel with the longitudinal axis of each of the channels 109, the ramp portion of each of the legs of the clip 125 may interact with the corresponding holes 133 in the first circuit board to bend the legs in a direction transverse to the longitudinal axis of each of the channels 109, for example so that the legs bend towards each other. Each bias provider 115 within each channel 109 is then compressed from its extended configuration to its compressed configuration as it is squeezed between the retaining member 119 and the first circuit board 101. Once the flange of each leg of the clip 125 passes over the first circuit board and past each corresponding hole 133, the legs snap into position so that the flange engages with the first circuit board 101 to detachably couple the electrically insulating housing 107 to the first circuit board 101, and retaining each bias provider 115 in each channel 109 between the retaining member 119 and the first circuit board 101 in its compressed configuration.

In operation, electrical signals from elements of the power electronics on the first circuit board 101, for example from a timing chip, pass from the first circuit board 101 to the second circuit board 103, through each of the conductors of each channel 109 and the corresponding contacts 116, 117, to control operation of elements of the power electronics on the second circuit board 103, for example to control operation of the inverter 150.

The power electronics assembly is configured to maintain an electrical connection between the first circuit board 101 and the second circuit board 103 in the event that the second circuit board 103 moves relative to the first circuit board 101 and/or the electrically insulating housing 107. Because the second circuit board 103 comprises inverter 150, it may get hot in use and expand and/or move relative to the first circuit board 101 and/or the electrically insulating housing 107. Each bias provider 115 and corresponding conductor is configured to accommodate this movement.

For example, if the second circuit board 103 moves in a direction transverse to the longitudinal axis of each of the channels 109, each corresponding conductor, for example each pin 121, can slide over each corresponding contact 117 on the second circuit board 103 to accommodate this movement whilst still maintaining an electrical connection between the first circuit board 101 and the second circuit board 103. As another example, if the second circuit board 103 moves in a direction parallel to the longitudinal axis of each of the channels 109, each corresponding conductor, for example each pin 121, can project further out of each of the second plurality of apertures 113, due to the bias of bias provider 115, to maintain contact with each corresponding contact 117 on the second circuit board 103 to accommodate this movement whilst still maintaining an electrical connection between the first circuit board 101 and the second circuit board 103.

In an embodiment there is provided a power electronics assembly for an electric motor controller comprising:

a first circuit board, a second circuit board and an electrically insulating housing coupled to the first circuit board, wherein the second circuit board comprises an insulated metal substrate, and the electrically insulating housing comprises:

a plurality of channels, wherein each channel terminates in a first aperture on a first side of the electrically insulating housing and a second aperture on a second side of the electrically insulating housing;

wherein each channel holds a bias provider, each bias provider configured to project a corresponding conductor through a corresponding one of the first plurality of apertures and through a corresponding one of the second plurality of apertures to electrically couple the first circuit board with the second circuit board;

wherein each bias provider is configured to press each corresponding conductor against a corresponding contact on at least one of the circuit boards to maintain an electrical connection between the first circuit board and the second circuit board in the event that the second circuit board moves relative to the first circuit board and the electrically insulating housing.

In such power electronics assemblies the electrically insulating housing may be detachably coupled to the first circuit board, for example the electrically insulating housing may comprise a clip for detachably coupling the electrically insulating housing to the first circuit board.

In an embodiment there is also provided an electrical coupling for coupling a first circuit board to a second circuit board of an electric motor controller comprising an electrically insulating housing, the electrically insulating housing configured to detachably couple to the first circuit board, and wherein the electrically insulating housing comprises: a plurality of channels, wherein each channel terminates in a first aperture on a first side of the electrically insulating housing and a second aperture on a second side of the electrically insulating housing; a clip for detachably coupling the electrically insulating housing to the first circuit board; wherein each channel holds a bias provider and a retaining member, each bias provider configured to project a corresponding conductor through a corresponding one of the first plurality of apertures and through a corresponding one of the second plurality of apertures to electrically couple the first circuit board with the second circuit board; wherein each bias provider is configured to press each corresponding conductor against a corresponding contact on at least one of the circuit boards to maintain an electrical connection between the first circuit board and the second circuit board; and wherein the power electronics coupler is configured to retain each bias provider between each corresponding retaining member and the first circuit board when the electrically insulating housing is coupled to the first circuit board.

A portion of the clip may be configured to move in a direction transverse to the longitudinal axis of each channel when the electrically insulating housing is detachably coupled to the first circuit board. The clip may comprise at least two legs, the legs each adapted to snap-fit with a corresponding hole in the first circuit board. The detachable coupling arrangement may comprise a locator pin for aligning the electrically insulating housing with the first circuit board. Each bias provider may be configured to press each corresponding conductor against a corresponding contact on at least one of the circuit boards along an axis corresponding to a longitudinal axis of each channel. Each bias provider may be configured to press each corresponding conductor against a corresponding contact on the first circuit board and against a corresponding contact on the second circuit board to maintain an electrical connection between the first circuit board and the second circuit board. Each bias provider may comprise the corresponding conductor. The electrically insulating housing's first side may be adapted to abut and form a seal with the first circuit board when coupled to the first circuit board. The electrically insulating housing's second side may be adapted to abut and form a seal with the second circuit board when the electrically insulating housing is coupled to the first circuit board and the first circuit board is coupled to the second circuit board. The electrically insulating housing may be configured to align each corresponding conductor with a corresponding electrically conductive pad on the first circuit board and a corresponding electrically conductive pad on the second circuit board. Each of the plurality of channels and corresponding first and second apertures may be equally spaced.

Each of the channels of the electrically insulating housing may comprise a retaining member, and wherein each retaining member is configured to interact with each bias provider to project a corresponding conductor through a corresponding one of the first plurality of apertures and project the conductor through a corresponding one of the second plurality of apertures to electrically couple the first circuit board with the second circuit board. The electrically insulating housing may be configured to retain the bias provider between the retaining member and the first circuit board, for example the retaining member may comprise a flange at an end of each of the channels, for example the second plurality of apertures can be narrower than the first plurality of apertures. Each retaining member may comprise a narrowing of a corresponding one of the second plurality of apertures with respect to each of the corresponding first plurality of apertures. Each bias provider may extend the full length of each corresponding channel.

It will be appreciated in the context of the present disclosure that the first circuit board may be mechanically coupled to the second circuit board and the two circuit boards may be separated by a predetermined distance. The electrically insulating housing may be configured to fit within the predetermined distance between the two circuit boards. The power electronics assembly may comprise a power contact, wherein the power contact couples an inverter on the second circuit board to an electrical circuit on the first circuit board and is configured to pass DC current from the inverter on the second circuit board to the electrical circuit on the first circuit board.

It will be appreciated in the context of the present disclosure that the first circuit board of the power electronics assembly may comprise a timing chip, and the second circuit board of the power electronics assembly comprises a gate drive circuit and/or transistors for controlling the power electronics. In these embodiments the conductors of the electrically insulating housing may be arranged to electrically couple the timing chip of the first circuit board to the gate drive circuit and/or transistors of the second circuit board.

The conductors may each comprise a pin, wherein each pin is configured to project through a corresponding one of the second plurality of apertures to press against a corresponding contact on at least one of the circuit boards.

It will be appreciated in the context of the present disclosure that the first circuit board may comprises a composite material such as fiberglass, for example FR4. The second circuit board may comprise an insulated metal substrate, such as aluminium substrate. The substrate may be covered in an insulator such as polyamide, for example Kapton®. A circuit may be printed over the insulator. The insulated metal substrate is coupled to a heat sink. For example it may be clamped to the heatsink, for example using one or more fittings which press it against the heat sink. A thermally conductive paste may be provided between the substrate and the heat sink.

Embodiments of the disclosure also provide a method of manufacturing a power electronics assembly, the method comprising: providing a first circuit board; providing an electrically insulating housing, the housing comprising a plurality of channels, wherein each channel terminates in a first aperture on a first side of the electrically insulating housing and a second aperture on a second side of the electrically insulating housing and wherein each channel comprises a retaining member; inserting a corresponding bias provider through each first aperture into each channel to engage each corresponding retaining member, each bias provider configured to project a corresponding conductor through a corresponding one of the first plurality of apertures and through a corresponding one of the second plurality of apertures; coupling the electrically insulating housing to the first circuit board so that the first side faces the first circuit board, thereby trapping each bias provider within each corresponding channel of the electrically insulating housing between each corresponding retaining member and the first circuit board. Such methods may comprise mechanically coupling the first circuit board to a second circuit board, so that the second side of the electrically insulating housing faces the second circuit board, and each of the conductors electrically engages with a corresponding contact on the first circuit board and on the second circuit board to electrically couple the first circuit board to the second circuit board.

The electrically insulating housing may comprise a clip, and coupling the electrically insulating housing to the first circuit board comprises pressing the electrically insulating housing against the first circuit board in a direction parallel to the longitudinal axis of each of the channels, and further comprises moving a portion of the clip in a direction transverse to the longitudinal axis of each of the channels as the electrically insulating housing is pressed against the first circuit board.

Each of the plurality of conductors may be arranged in a corresponding one of the plurality of channels and seated against a retaining member of said corresponding one of the plurality of channels. Each of the plurality of conductors may be arranged to provide resilient movement of at least part of said conductor in a bias direction along the channel. The bias direction may correspond to the longitudinal axis of each of the channels.

The electrically insulating housing may comprise a rigid locator, for example a locator pin, and coupling the electrically insulating housing to the first circuit board may comprise aligning the locator pin with a corresponding hole on the first circuit board, and pressing the electrically insulating housing against the first circuit board so that the locator pin slides within the corresponding hole in the first circuit board.

The rigid locator may be adapted to oppose a force on the electrically insulating housing caused by an interaction between the restraint and the first circuit board to inhibit movement of the electrically insulating housing relative to the first circuit board. For example, in embodiments where the restraint comprises a flexible leg, when the restraint is coupled to the first circuit board it may exert a biasing force on the electrically insulating housing in a direction transverse to the bias direction of the conductors and/or in a direction transverse to the longitudinal axis of each of the channels, and the rigid locator may be adapted to oppose this biasing force to inhibit movement of the electrically insulating housing relative to the first circuit board.

The restraint may be adapted to form an interference fit with a first circuit board. For example, the restraint may comprise a member adapted to fit with a corresponding part of the first circuit board. For example, the restraint may comprise a male member adapted to mate with a corresponding female member of the first circuit board.

The restraint may comprise a clip. For example, the restraint may comprise a snap-fit coupling. The snap-fit coupling may be a mechanical joint system where part-to-part attachment is accomplished with locating and locking features. The locating and locking features may be homogenous with one or other of the components being joined. Joining may involve one of the locking features moving aside for engagement with the mating part, followed by return of the locking feature toward its original position to latch the components together.

In the context of the present disclosure other examples and variations of the apparatus and methods described herein will be apparent to a person of skill in the art.

What is claimed is:

1. An electrical coupling assembly for coupling a first circuit board to a second circuit board of an electric motor controller, the assembly comprising:
   an electrically insulating housing;
   a plurality of channels through the electrically insulating housing, wherein each channel comprises an open end and a retaining member;
   a plurality of conductors each arranged in a corresponding one of the plurality of channels and seated against the retaining member of said corresponding one of the plurality of channels and arranged to provide resilient movement of at least part of said conductor in a bias direction along the channel; and
   a restraint adapted to secure the electrically insulating housing to the first circuit board thereby to close the open end of the channels to trap the conductors between the retaining members and the first circuit board and to bias the conductors into electrical contact with an electrical conductor of the first circuit board;
   wherein the restraint is adapted to hold the electrically insulating housing at a selected location on the first circuit board so that the electrically insulating housing abuts the first circuit board, and wherein the restraint comprises:
      a rigid locator arranged to locate the electrically insulating housing at the selected location and to allow movement of the electrically insulating housing in the bias direction; and
      at least one flexible leg adapted to be deflected transverse to the bias direction; and
      wherein the rigid locator extends further from the electrically insulating housing in the bias direction than does the at least one flexible leg, and wherein the rigid locator is arranged to inhibit lateral movement of the electrically insulating housing across the first circuit board.

2. The assembly of claim 1 wherein each channel terminates in a first aperture on the first side of the electrically insulating housing and a second aperture on a second side of the electrically insulating housing, and each conductor comprises a bias provider configured to project the corresponding one of the conductors through a corresponding one of the first plurality of apertures and through a corresponding one of the second plurality of apertures for electrically coupling the first circuit board with the second circuit board, wherein the assembly is configured to retain each bias provider between each corresponding retaining member and the first circuit board when, in use, the electrically insulating housing is coupled to the first circuit board by the restraint.

3. The assembly of claim 2, wherein the bias providers are arranged to provide force in a bias direction transverse to the first circuit board, wherein the restraint is adapted to hold the electrically insulating housing at a selected location on the first circuit board, comprising a rigid locator arranged to locate the electrically insulating housing at the selected location and to allow movement of the electrically insulating housing in the bias direction, wherein the restraint comprises a clip having flexible legs adapted to be deflected transverse to the bias direction, wherein the flexible legs are resilient.

4. The assembly of claim 1, wherein the at least one flexible leg is adapted to allow the electrically insulating housing to be locked in position at the selected location, wherein the rigid locator is arranged to inhibit lateral movement of the electrically insulating housing across the first circuit board, and the flexible legs are arranged to hold the electrically insulating housing against the first circuit board in opposition to the force applied to the electrically insulating housing by the biasing of the plurality of conductors, wherein the rigid locator is adapted to oppose a force transverse to the bias direction on the electrically insulating housing caused by interaction between the restraint and the first circuit board, wherein the at least one flexible leg comprises a flange adapted to lock the electrically insulating housing to a circuit board, and a ramp adapted to deflect the at least one flexible leg, wherein the restraint comprises at least two legs, the legs each adapted to snap-fit with a corresponding hole in the first circuit board, wherein the rigid locator comprises at least one locator pin for aligning the electrically insulating housing at a selected location on the first circuit board.

5. The assembly of claim 1 wherein each conductor comprises a bias provider, such as a spring, configured to press each corresponding conductor against a corresponding contact on at least one of the circuit boards along an axis corresponding to a longitudinal axis of each channel.

6. The assembly of claim 5, wherein each bias provider comprises the corresponding conductor, wherein the conductors are provided by springs.

7. The assembly of claim 1 wherein each conductor comprises at least one pin to engage a contact on at least one of the circuit boards.

8. The assembly of claim 1 wherein each conductor comprises a coil or helix structure that varies in diameter over a portion of the length of the conductor.

9. The assembly of claim 1 wherein each conductor is configured to project through a corresponding one of a first plurality of apertures of the electrically insulating housing, wherein the electrically insulating housing is configured to retain a portion of each conductor between the retaining member and the first circuit board, wherein the retaining members each comprises a flange, and/or wherein the channels comprise a narrow region adapted to provide said retaining member.

10. The assembly of claim 1 wherein the second circuit board comprises an insulated metal substrate, with a printed circuit board printed over the insulated metal substrate, wherein the insulated metal substrate is coupled to a heat sink.

11. An electric motor controller comprising an assembly according to claim 1.

12. The assembly of claim 1, wherein the restraint is adapted to one of:
   a) be at least partially deflected transverse to the bias direction; and
   b) mechanically secure the electrically insulating housing to the first circuit board via an interference fit.

13. The assembly of claim 1, wherein the restraint is adapted to engage and mechanically secure the electrically insulating housing to the first circuit board in the bias direction thereby to close the open end of the channels to trap the conductors between the retaining members and the first circuit board and to bias the conductors into electrical contact with an electrical conductor of the first circuit board; the electrical coupling assembly further comprising a rigid locator adapted to align the electrically insulating housing with a location on the first circuit board prior to engagement of the restraint with the first circuit board and to permit movement of the electrically insulating housing in the bias direction.

14. The assembly of claim 1, further comprising the first circuit board and the second circuit board; wherein
the second circuit board is spaced from the first circuit board by a stand-off distance;
the electrically insulating housing is held between the first circuit board and the second circuit board;
each of the plurality of conductors are arranged to provide a conduction path through a corresponding one of the plurality of channels;
the restraint is adapted to hold the electrically insulating housing to the first circuit board against a force on the electrically insulating housing caused by the biasing of the plurality of conductors; and
the second circuit board is held to the first circuit board by a fixture such that the second circuit board presses the conductors to reduce the force on the electrically insulating housing caused by the biasing of the plurality of conductors.

15. The assembly of claim 14, wherein the first circuit board is arranged at a first side of the housing to close the channels thereby to hold the conductors in the channels.

16. The assembly of claim 1, wherein the channels are arranged to retain the conductors in the event that the second circuit board is unfixed from the first circuit board.

17. A method of manufacturing a power electronics assembly, the method comprising:
providing an electrically insulating housing comprising a plurality of channels, wherein each channel comprises a retaining member;
arranging a conductor in each channel each a plurality of conductors is arranged to provide a conduction path through a corresponding one of the plurality of channels and so that, in each channel, wherein the conductor includes a bias provider seated against the retaining member and arranged to permit resilient movement of the each one of the plurality of conductors in a bias direction along each channel;
coupling the electrically insulating housing to a first circuit board to enclose the plurality of conductors in the plurality of channels so that the bias providers urge the conductors into electrical contact with the first circuit board;
wherein coupling the electrically insulating housing to the first circuit board comprises:
aligning a rigid locator, coupled to the electrically insulating housing, with a hole on the first circuit board, and
deflecting a flexible leg, coupled to the electrically insulating housing, transverse to the bias direction, to hold the electrically insulating housing at a selected location on the first circuit board so that the electrically insulating housing abuts the first circuit board;
wherein the rigid locator extends further from the electrically insulating housing in the bias direction than does the at least one flexible leg, and wherein the rigid locator is arranged to inhibit lateral movement of the electrically insulating housing across the first circuit board; and
fixing a second circuit board to the first circuit board to bring the second circuit board into electrical contact with the plurality conductors and to further urge the plurality of conductors into electrical contact with the first circuit board.

18. The method of claim 17, wherein each channel terminates in a first aperture on a first side of the electrically insulating housing and a second aperture on a second side of the electrically insulating housing, the method comprising inserting a conductors through each first aperture into each channel to engage each corresponding retaining member, and closing the first apertures with the first circuit board, wherein closing the first apertures comprises trapping the bias providers within each corresponding channel of the electrically insulating housing between each corresponding retaining member and the first circuit board.

19. The method of claim 17, further comprising mechanically coupling the first circuit board to a second circuit board using a fixture, such as a bolt, so that the second side of the electrically insulating housing faces the second circuit board, and each of the conductors electrically engages with a corresponding contact on the first circuit board and on the second circuit board to electrically couple the first circuit board to the second circuit board.

20. The method of claim 19, wherein the electrically insulating housing further comprises a clip, and coupling the electrically insulating housing to the first circuit board comprises pressing the electrically insulating housing against the first circuit board in a direction parallel to the longitudinal axis of each of the channels, and further comprises moving a portion of the clip in a direction transverse to the longitudinal axis of each of the channels as the electrically insulating housing is pressed against the first circuit board.

* * * * *